United States Patent
Sano et al.

(10) Patent No.: US 6,461,961 B1
(45) Date of Patent: Oct. 8, 2002

(54) METHODS OF MANUFACTURING SEMICONDUCTOR DEVICES WITH RUTHENIUM FILMS FORMED BY CVD USING AN OXYGEN-CONTAINING REACTANT GAS

(75) Inventors: Atsushi Sano; Tsukasa Ohoka, both of Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 09/963,665

(22) Filed: Sep. 27, 2001

(30) Foreign Application Priority Data

Sep. 28, 2000 (JP) ........................................ 2000-295753

(51) Int. Cl.$^7$ ............................................. H01L 21/443
(52) U.S. Cl. ........................................ 438/686; 438/681
(58) Field of Search .................................. 438/686, 681, 438/680, 650; 427/255.28; 257/769

(56) References Cited

U.S. PATENT DOCUMENTS

| | | | | |
|---|---|---|---|---|
| 5,372,849 A | * | 12/1994 | McCormick et al. | 427/253 |
| 6,074,945 A | * | 6/2000 | Vaartstra et al. | 438/681 |
| 6,380,080 B2 | * | 4/2002 | Visokay | 438/681 |
| 2002/0048940 A1 | * | 4/2002 | Derderian et al. | 438/650 |

FOREIGN PATENT DOCUMENTS

JP   10-163131   6/1998

OTHER PUBLICATIONS

S.–E. Park, "Metallorganic Chemical Vapor Deposition of Ru and RuO2 Using Ruthenocene Precursor and Oxygen Gas," j. Electrochem. Soc. v. 147, No. 1, pp. 203–209, Jan. 2000.*

M. Hiratani et al., A Conformal Ruthenium Electrode for MIM Capacitors in Gbit DRAMs Using the CVD Technology Based on Oxygen–Controlled Surface Reaction, 2000 Symposium on VLSI Technology Digest of Technical Papers, pp. 102–103, Jun. 2000.*

S.–J. Won, "Conformal CVD–Ruthenium Process for MIM Capacitor in Giga–Bit DRAMs," 2000 IEDM Technical Digest, pp. 789–792, Dec. 2000.*

* cited by examiner

*Primary Examiner*—Olik Chaudhuri
*Assistant Examiner*—Stephen W. Smoot
(74) *Attorney, Agent, or Firm*—McGinn & Gibb, PLLC (57) ABSTRACT

A semiconductor device manufacturing method is obtained which is capable of depositing a ruthenium film with excellent homogeneity in the film quality and excellent reproducibility of the surface morphology. The semiconductor device manufacturing method of the present invention includes heating a silicon wafer up to a temperature of 290–350° C. by means of a heater, supplying an $N_2$ gas to the reaction chamber thereby to hold the pressure in the reaction chamber at a level of 60–4,000 Pa, supplying to the reaction chamber a raw material gas containing ruthenium while decreasing the amount of supply of the $N_2$ gas, thereby to hold the pressure in the reaction chamber at a level of 60–4,000 Pa, supplying to the reaction chamber an oxygen-containing gas containing oxygen after the amount of supply of the raw material gas becomes constant while decreasing the amount of supply of the $N_2$ gas so as to hold the pressure in the reaction chamber at a level of 60–4,000 Pa, decreasing the amount of supply of the oxygen-containing gas after a ruthenium film is deposited, decreasing the amount of supply of the raw material gas so as to stop the supply of the oxygen-containing gas and the supply of the raw material gas, and increasing the amount of supply of the $N_2$ gas thereby to hold the pressure in the reaction chamber at a level of 60–4,000 Pa.

18 Claims, 7 Drawing Sheets

1 · · · silicon substrate
3 · · · source electrodes
4 · · · drain electrodes
5 · · · gate insulating films
6 · · · gate electrodes
12 · · · capacitance lower electrode
13 · · · capacitance insulating film
14 · · · capacitance upper electrode

Fig. 6

24 ··· gas supply pipe
27 ··· heater
29 ··· susceptor
30 ··· silicon wafer
32 ··· reaction chamber

Fig. 7

Prior Art

METHODS OF MANUFACTURING SEMICONDUCTOR DEVICES WITH RUTHENIUM FILMS FORMED BY CVD USING AN OXYGEN-CONTAINING REACTANT GAS

BACKGROUND OF THE INVENTION

1. Field of the Invention

The present invention relates to a semiconductor device manufacturing method and a substrate processing apparatus for depositing a ruthenium film or films on a substrate by using a raw material gas, which contains ruthenium, and an oxygen-containing gas, which contains oxygen.

2. Description of the Related Art

Figure 7:
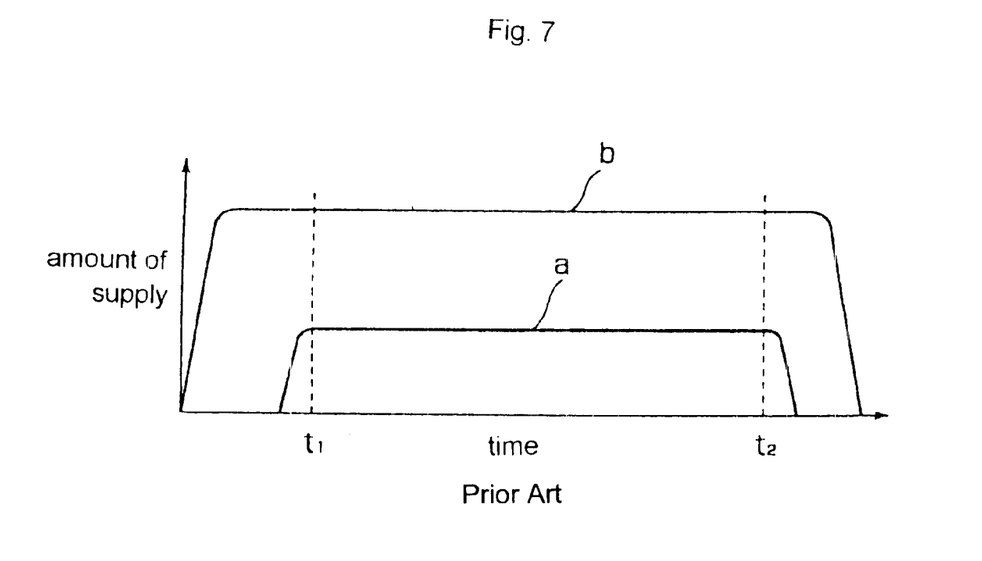
FIG. 7 is an explanatory view of a known semiconductor device manufacturing method.

In the past, when a ruthenium film is deposited on a silicon wafer by a thermal CVD method by using a raw material gas containing ruthenium and an oxygen-containing gas containing oxygen, the oxygen-containing gas, which is the gas with a greater flow rate of supply, is supplied prior to or earlier than the ruthenium raw gas, which is the gas with a smaller flow rate of supply, as illustrated in FIG. 7. (Line a represents a change in the amount of supply of the ruthenium raw gas, and line b represents a change in the amount of supply of the oxygen-containing gas.) This is carried out so as to suppress pressure fluctuations at the time of deposition. That is, the supply of the ruthenium raw gas is started to initiate deposition of ruthenium films after the amount of supply of the oxygen-containing gas becomes constant. Then, after the deposition of the ruthenium films is completed, the supply of the oxygen-containing gas is stopped after the supply of the ruthenium raw gas is stopped.

However, in such a gas supply method, the oxygen ratio, i.e., the volume ratio of the oxygen-containing gas to the ruthenium raw gas becomes greater before the start of deposition (before time $t_1$) and after the end of deposition (after time $t_2$), and hence oxygen becomes excessive so that ruthenium oxide can be easily formed, thus impairing homogeneity or uniformity in the film quality of the ruthenium films. Also, the sheet resistance or the like of the ruthenium films becomes non-uniform, and the reproducibility of the surface morphology becomes poor, too.

SUMMARY OF THE INVENTION

The present invention is intended to obviate the problems as referred to above, and has for its object to provide a semiconductor device manufacturing method and a substrate processing apparatus which is capable of depositing a ruthenium film with excellent homogeneity in the film quality and excellent reproducibility of the surface morphology.

In order to achieve this object, according to the present invention, in a semiconductor device manufacturing method in which a ruthenium film is deposited on a substrate by using a raw material gas containing ruthenium and an oxygen-containing gas containing oxygen, an oxygen ratio before the start of deposition of the ruthenium film or after the end of deposition thereof is controlled to be smaller than an oxygen ratio at the time of deposition thereof. Incidentally, note that the oxygen ratio referred to herein means a volume ratio of the oxygen-containing gas to the ruthenium raw gas.

Moreover, in a semiconductor device manufacturing method in which a ruthenium film is deposited on a substrate by using a raw material gas containing ruthenium and an oxygen-containing gas containing oxygen, an oxygen ratio before the start of deposition of the ruthenium film or after the end of deposition thereof is controlled to be not greater than a value at which there takes place no deposition reaction.

In these cases, the raw material gas may be supplied earlier than the oxygen-containing gas before the start of deposition of the ruthenium film.

In addition, the amount of supply of the oxygen-containing gas before the start of deposition may be gradually increased when the raw material gas and the oxygen-containing gas are supplied at the same time before the start of deposition of the ruthenium film.

Further, the amount of supply of the oxygen-containing gas before the start of deposition may be controlled to be smaller than the amount of supply of the oxygen-containing gas at the time of deposition, or the amount of supply of the oxygen-containing gas before the start of deposition may be controlled to be not greater than a value at which there takes place no deposition reaction.

Furthermore, the supply of the oxygen-containing gas may be stopped earlier than the supply of the raw material gas after the end of deposition of the ruthenium film.

Still further, the amount of supply of the oxygen-containing gas after the end of deposition may be gradually decreased when the supply of the raw material gas and the supply of the oxygen-containing gas are stopped at the same time after the end of deposition of the ruthenium film.

Besides, when the supply of the raw material gas is stopped earlier than the supply of the oxygen-containing gas after the end of deposition of the ruthenium film, the amount of supply of the oxygen-containing gas after the end of deposition may be controlled to be smaller than the amount of supply of the oxygen-containing gas at the time of deposition, or the amount of supply of the oxygen-containing gas after the end of deposition may be controlled to be not greater than a value at which there takes place no deposition reaction.

Additionally, a gas, which does not contribute to deposition reactions, may be introduced before the start of deposition of the ruthenium film or after the end of deposition thereof so as to hold substantially constant the pressures before the start of deposition, at the time of deposition and after the end of deposition.

Moreover, the present invention may be characterized in that the raw material gas containing ruthenium comprises a gas evaporated from $Ru(C_2H_5C_5H_4)_2$, and that the oxygen-containing gas containing oxygen comprises an $O_2$ gas.

Furthermore, the present invention provides a substrate processing apparatus in which a ruthenium film is deposited on a substrate in a reaction chamber by using a raw material gas containing ruthenium and an oxygen-containing gas containing oxygen, the apparatus being characterized by comprising: an oxygen-containing gas supply section for supplying the oxygen-containing gas to a reaction chamber; a raw material gas supply section for supplying the raw material gas to the reaction chamber; and a controller for controlling the oxygen-containing gas supply section and the raw material gas supply section in such a manner that an oxygen ratio before the start of deposition of the ruthenium film or after the end of deposition thereof is made smaller than an oxygen ratio at the time of deposition thereof.

DESCRIPTION OF THE PREFERRED EMBODIMENTS

Figure 6:
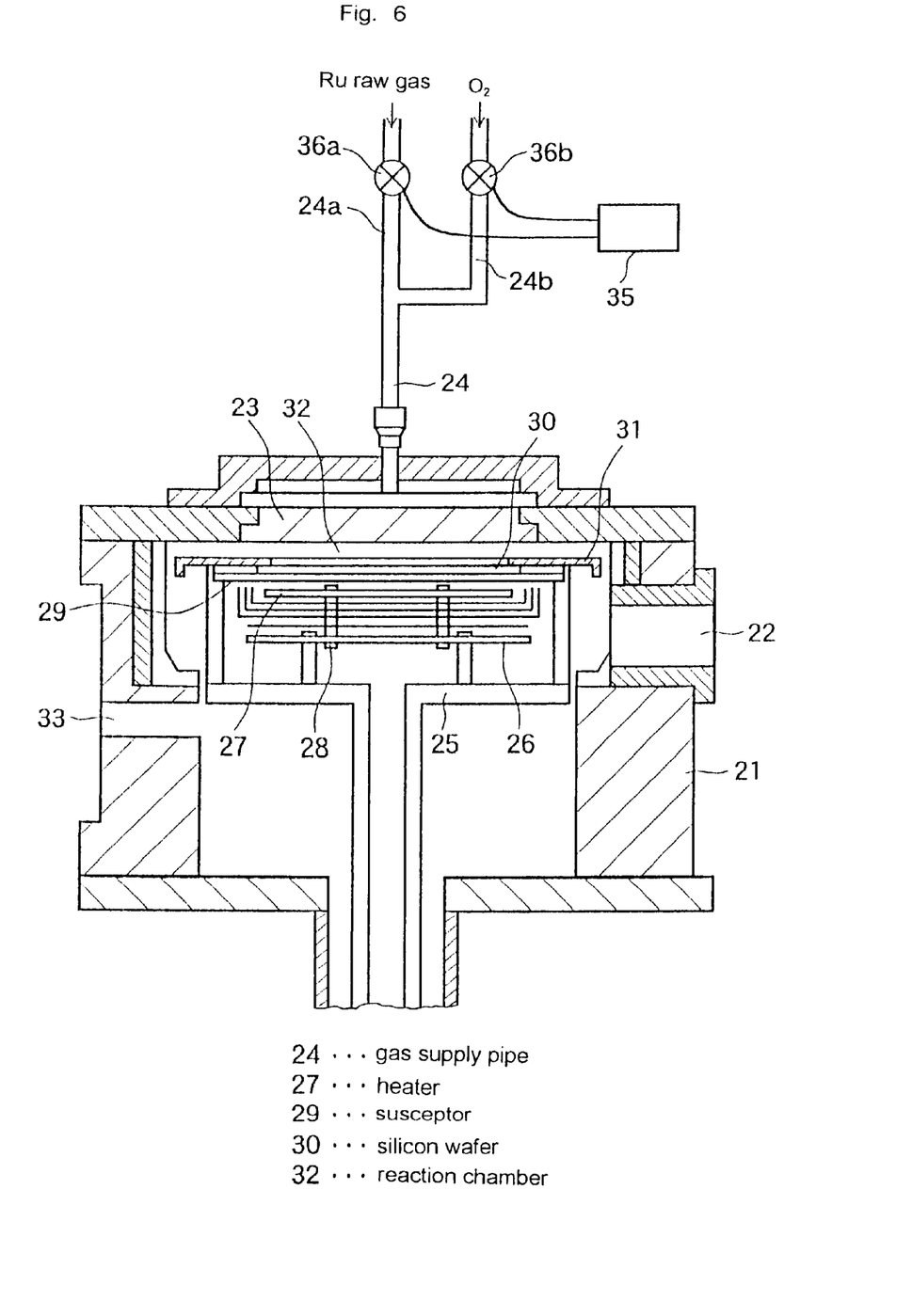
FIG. 6 is a cross sectional view illustrating a semiconductor manufacturing apparatus (substrate processing apparatus) according to the present invention.

FIG. 6 is a cross sectional view illustrating one example of a thermal CVD apparatus according to the present invention, that is, a semiconductor manufacturing apparatus used when ruthenium films are deposited on a silicon wafer in the manufacture of a DRAM. As shown in this figure, an exhaust port 22 is provided in a main body 21 of the apparatus, and a shower head 23 is provided at an upper portion of the main body 21. Mounted on the main body 21 is a gas supply pipe 24 which opens into a space defined above the shower head 23. Also, the gas supply pipe 24 is branched at its upstream side into a ruthenium raw gas supply pipe 24a, which supplies a raw material gas containing ruthenium, and an oxygen-containing gas supply pipe 24b, which supplies an oxygen-containing gas containing oxygen. Valves 36a and 36b are provided on the gas supply pipes, respectively. The gas supply pipe 24a and the valve 36a together constitute a ruthenium raw gas supply section, and the gas supply pipe 24b and the valve 36b together constitute an oxygen-containing gas supply section. In addition, a controller 35 is provided for the valves 36a and 36b. The openings of the valves 36a and 36b are adjusted by this controller 35 so that the timing of starting and stopping the gas supplies as well as the amounts of supply of the gases are properly controlled. Moreover, a support member 25 is mounted on the main body 21 for vertical movement, and a base 26 is attached to the support member 25. A heater 27 is installed on the base 26 through a heater electrode 28. A susceptor 29 is mounted on the support member 25. A silicon wafer 30 is disposed on the susceptor 29 with a cover plate 31 being placed on the support member 25. Additionally, a reaction chamber 32 is defined in the main body 21 for processing or treating the silicon wafer 30 therein. Incidentally, 33 in this figure designates a substrate transportation opening through which the silicon wafer 30 is transported to the susceptor 29 in the main body 21.

Now, reference will be made to a method of depositing ruthenium films on a silicon wafer by using this semiconductor manufacturing apparatus. First of all, a silicon wafer 30 is transported into the main body 21 through the substrate transportation opening 33 so as to be placed on the susceptor 29 with the support member 25 having been descended to a location near the substrate transportation opening 33, and by lifting the support member 25, the silicon wafer 30 on the susceptor 29 is vertically moved upward to a processing position in the reaction chamber 32 where the silicon wafer 30 is heated up to a processing temperature by means of the heater 27. Subsequently, a raw material gas containing ruthenium is supplied to the reaction chamber 32 by the gas supply pipes 24a and 24 through the space above the shower head 23 and the shower head 23 itself, and when the amount of the ruthenium raw gas thus supplied becomes constant or steady, an oxygen-containing gas containing oxygen is supplied from the gas supply pipe 24b. In this case, the ruthenium raw gas is mixed with the oxygen-containing gas in the piping, and thereafter supplied onto the silicon wafer 30 through the shower head 23, whereby the oxygen in the oxygen-containing gas chemically reacts with the ruthenium raw gas, thus depositing ruthenium films on the silicon wafer 30. Subsequently, the supply of the oxygen-containing gas is stopped, and the supply of the ruthenium raw gas is then stopped. The reaction chamber 32 is purged by an inert gas such as an $N_2$ gas, etc. After the residual gas has been removed, the support member 25 is downwardly moved to descend the processed silicon wafer 30 to a wafer transportation position, where the wafer is taken out or removed from the apparatus through the substrate transportation opening 33.

Figure 1:
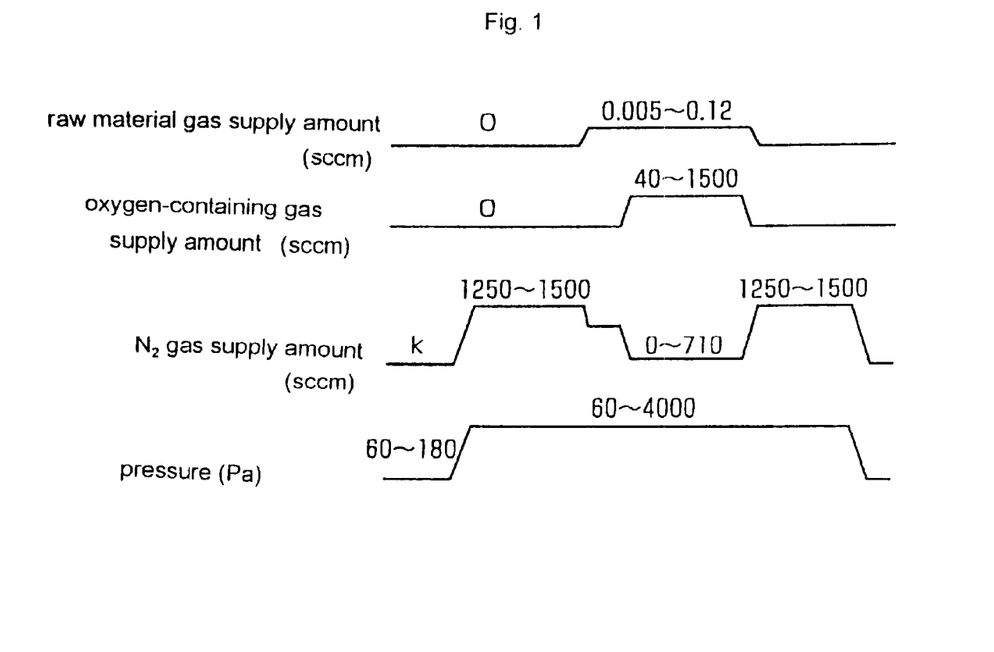
FIG. 1 is an explanatory view of a semiconductor device manufacturing method according to the present invention.

Next, reference will be made to the timing of supplying the gases, which is characteristic of the semiconductor device manufacturing method according to the present invention, while referring to FIG. 1. First, as described above, the silicon wafer 30 disposed on the susceptor 29 in the semiconductor manufacturing apparatus is lifted to the deposition position in the reaction chamber 32, where the silicon wafer 30 is heated up to a temperature of 290–350° C. by means of the heater 27. Subsequently, an $N_2$ gas, which does not contribute to deposition reactions, is supplied to the reaction chamber in an amount of k sccm. Here, note that the amount of the gas supply k sccm is an amount of supply by which the pressure in the reaction chamber 32 can be held in a range of 60–180 Pa. Then, the amount of the $N_2$ gas supplied is adjusted to a range of 1,250–1,500 sccm, and the pressure in the reaction chamber 32 is raised to a value ranging from 60 to 4,000 Pa. Thereafter, a raw material gas containing ruthenium such as, for example, a gas evaporated from a liquid raw material $Ru(C_2H_5C_5H_4)_2$ (referred to as bisethyl-cyclopentadienyl-ruthenium), is supplied from the ruthenium raw gas supply pipe 24a to the reaction chamber 32 in an amount of supply ranging from 0.005 to 0.12 sccm while decreasing the amount of supply of the $N_2$ gas, thereby holding the pressure in the reaction chamber 32 at a range of 60–4,000 Pa. Subsequently, after the amount of supply of the ruthenium raw gas has become constant or steady, an oxygen-containing gas containing oxygen such as, for instance, an $O_2$ gas, is supplied to the reaction chamber from the oxygen-containing gas supply pipe 24b in an amount of supply ranging from 40 to 1,500 sccm while decreasing the amount of supply of the $N_2$ gas to a value ranging from 0 to 710 sccm, thereby holding the pressure in the reaction chamber 32 in a range of 60–4,000 Pa. Here, note that an $O_3$ gas or an $N_2O$ gas may be used as the oxygen-containing gas. In this manner, the deposition of ruthenium films is initiated. That is, the ruthenium raw gas is supplied prior to or earlier than the oxygen-containing gas, so that the oxygen ratio, i.e., the volume ratio of the oxygen-containing gas to the ruthenium raw gas, before the start of deposition of the ruthenium films is controlled to be smaller than the oxygen ratio at the time of deposition, and not greater than a value at which there takes place no deposition reaction in which ruthenium is separated from the ruthenium raw gas. Then, the amount of the oxygen-containing gas to be supplied is decreased, and thereafter the amount of the ruthenium raw gas to be supplied is also decreased. Thus, after the supply of the oxygen-containing gas is stopped, the supply of the ruthenium raw gas is also stopped, and the amount of the $N_2$ gas to be supplied is increased to a value ranging from 1,250 to 1,500 sccm, thereby holding the pressure in the reaction chamber 32 at a value ranging from 60 to 4,000 Pa. In this manner, the deposition of the ruthenium films is completed. After this, the amount of the $N_2$ gas to be supplied is decreased to a value of k sccm, whereby the pressure in the reaction chamber 32 is held at a level in the range of 60–180 Pa.

In this semiconductor device manufacturing method, the oxygen ratio before the start of deposition of ruthenium films is smaller than the oxygen ratio at the time of deposition and not greater than the value at which there occurs no deposition reaction in which ruthenium is separated from the ruthenium raw gas, so that there is deposited no ruthenium oxide, and hence the ruthenium films with excellent homogeneity in the film quality can be deposited, whereby it is possible to make uniform the sheet resistance or the like of the ruthenium films, and at the same time deposit the ruthenium films with excellent reproducibility of the surface morphology thereof. In addition, by supplying an $N_2$ gas, which is an inert gas not contributing to deposition reactions, and controlling the amount of supply thereof, before the start of deposition of ruthenium films, or after the end of deposition thereof, or during deposition thereof, the pressure in the reaction chamber before the start of deposition, during deposition and after the end of the deposition is held at a constant value in the range of 60–4,000 Pa, so that the pressure stability after the start of supply of the ruthenium raw gas can be easily improved, thus making it possible to stabilize the pressure during the deposition. Consequently, the ruthenium films with excellent homogeneity in the film quality can be deposited. Moreover, since the pressure can be stabilized before deposition, the stabilization in the control of pressure can be performed without using an expensive ruthenium raw gas.

Figure 2:
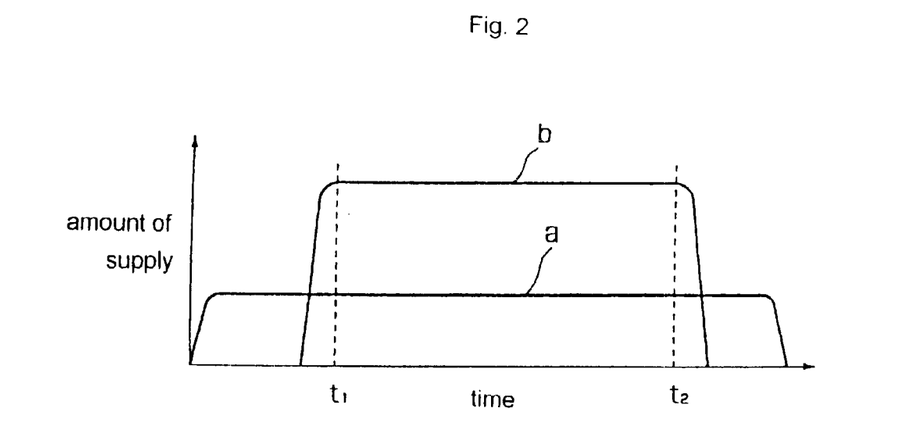
FIG. 2 is an explanatory view of another semiconductor device manufacturing method according to the present invention.

Now, reference will be made to another semiconductor device manufacturing method according to the present invention while referring to FIG. 2. (Line a represents a change in the amount of supply of the ruthenium raw gas, and line b represents a change in the amount of supply of the oxygen-containing gas.) First of all, a silicon wafer 30 disposed on the susceptor 29 in the semiconductor manufacturing apparatus is upwardly moved to the deposition position in the reaction chamber 32, where the silicon wafer 30 is heated up by the heater 27 to a temperature in the range of 290–350° C. Then, a ruthenium raw gas is started to be supplied to the reaction chamber 32, and after the amount of supply of the ruthenium raw gas becomes constant, an oxygen-containing gas is started to be supplied to the reaction chamber 32, thus initiating the deposition of ruthenium films. After the deposition of the ruthenium films has been completed, the supply of the oxygen-containing gas to the reaction chamber 32 is ended, and thereafter the supply of the ruthenium raw gas to the reaction chamber 32 is also finished. That is, before the start of deposition of the ruthenium films (before time $t_1$), the ruthenium raw gas is supplied to the reaction chamber prior to or earlier than the supply of the oxygen-containing gas, and the supply of the oxygen-containing gas is stopped earlier than the supply of the ruthenium raw gas after the end of deposition of the ruthenium films (after time $t_2$), whereby the oxygen ratio before the start of deposition of the ruthenium films and the oxygen ratio after the end of deposition thereof are made smaller than the oxygen ratio during the deposition, and not greater than a value at which there takes place no deposition reaction.

In such a semiconductor device manufacturing method, since the oxygen ratios before the start of deposition of the ruthenium films and after the end of deposition thereof are smaller than the oxygen ratio at the time of deposition and not greater than the value at which there takes place no deposition reaction, there is deposited no ruthenium oxide, and hence the ruthenium films with excellent homogeneity in the film quality can be deposited, whereby it is possible to make uniform the sheet resistance or the like of the ruthenium films, and at the same time deposit the ruthenium films with excellent reproducibility of the surface morphology thereof.

Figure 3:
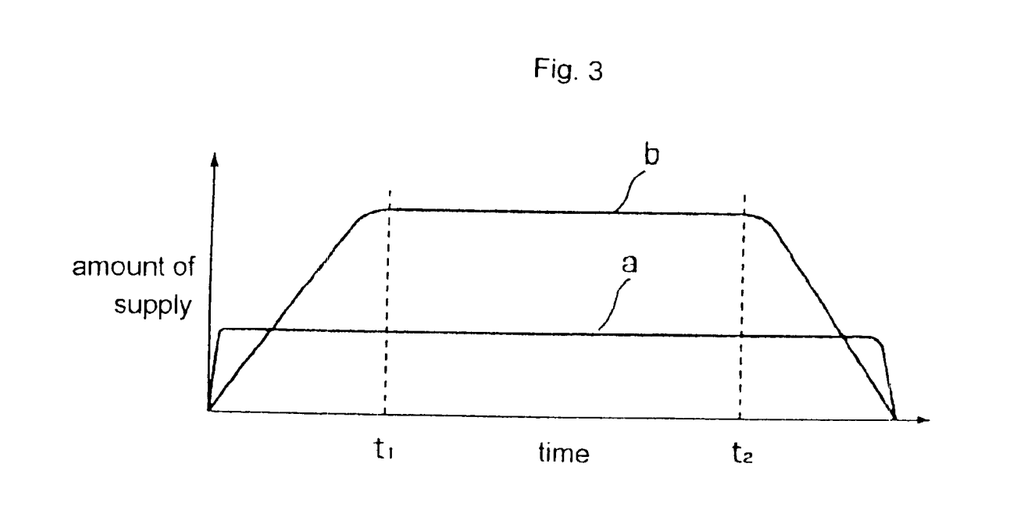
FIG. 3 is an explanatory view of a further semiconductor device manufacturing method according to the present invention.

Now, reference will be made to a further semiconductor device manufacturing method according to the present invention while referring to FIG. 3. (Line a represents a change in the amount of supply of the ruthenium raw gas, and line b represents a change in the amount of supply of the oxygen-containing gas.) First of all, a silicon wafer 30 disposed on the susceptor 29 in the semiconductor manufacturing apparatus is upwardly moved to the deposition position in the reaction chamber 32, where the silicon wafer 30 is heated up by the heater 27 to a temperature in the range of 290–350° C. Then, a ruthenium raw gas and an oxygen-containing gas are started to be supplied to the reaction chamber 32 at the same time. In this case, the amount of supply of the ruthenium raw gas is made constant earlier than that of the oxygen-containing gas, and the amount of supply of the oxygen-containing gas is made constant after the amount of supply of the ruthenium raw gas becomes constant, whereby the deposition of ruthenium films is started. Incidentally, note that the amount of supply of the oxygen-containing gas is gradually increased from the start of the supply until the time when the amount of supply of the oxygen-containing gas becomes constant. Then, after the deposition of the ruthenium films is completed, the supply of the ruthenium raw gas and the supply of the oxygen-containing gas to the reaction chamber are ended at the same time. In this case, the amount of supply of the oxygen-containing gas is gradually decreased before the supplies of the ruthenium raw gas and the oxygen-containing gas to the reaction chamber are stopped. That is, the raw material gas and the oxygen-containing gas are supplied at the same time before the start of deposition of the ruthenium films (before time $t_1$), and the amount of supply of the oxygen-containing gas before the start of deposition is gradually increased linearly, whereas the amount of supply of the oxygen-containing gas is gradually decreased linearly after the end of deposition of the ruthenium films (after time $t_2$), and the supply of the raw material gas and the supply of the oxygen-containing gas are stopped at the same time.

In this semiconductor device manufacturing method, too, since the oxygen ratios before the start of deposition of the ruthenium films and after the end of deposition thereof are smaller than the oxygen ratio at the time of deposition and not greater than the value at which there takes place no deposition reaction, there is deposited no ruthenium oxide, and hence it is possible to deposit the ruthenium films with excellent homogeneity in the film quality, and at the same time deposit the ruthenium films with excellent reproducibility of the surface morphology thereof.

Figure 4:
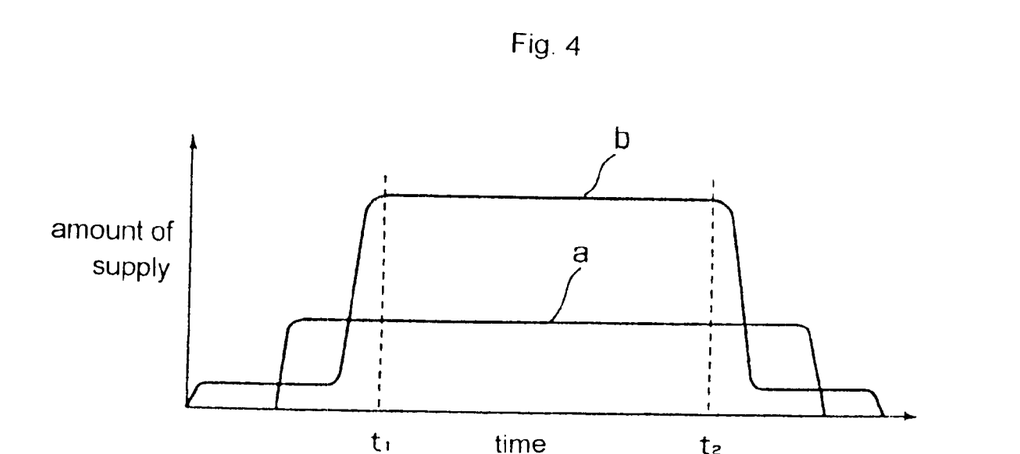
FIG. 4 is an explanatory view of a still further semiconductor device manufacturing method according to the present invention.

Now, reference will be made to a still further semiconductor device manufacturing method according to the present invention while referring to FIG. 4. (Line a represents a change in the amount of supply of the ruthenium raw gas, and line b represents a change in the amount of supply of the oxygen-containing gas.) First of all, a silicon wafer 30 disposed on the susceptor 29 in the semiconductor manufacturing apparatus is upwardly moved to the deposition position in the reaction chamber 32, where the silicon wafer is heated up by the heater 27 to a temperature in the range of 290–350° C. Then, an oxygen-containing gas is first started to be supplied to the reaction chamber 32, and after the amount of supply of the oxygen-containing gas becomes constant or steady, a ruthenium raw gas is started to be supplied to the reaction chamber 32. In this case, the amount of supply of the oxygen-containing gas is made slight (to such an extent as not to cause deposition reactions). Subsequently, after the amount of supply of the ruthenium raw gas becomes constant, the amount of supply of the oxygen-containing gas is increased to start the deposition of ruthenium films. After the deposition of the ruthenium films has been completed, the amount of supply of the oxygen-containing gas to the reaction chamber 32 is decreased so that the amount of supply of the oxygen-containing gas is made constant. In this case, the amount of supply of the oxygen-containing gas is made slight (to such an extent as not to cause deposition reactions). Then, the supply of the ruthenium raw gas is stopped, and thereafter the supply of the oxygen-containing gas to the reaction chamber 32 is also stopped. That is, before the start of deposition of the ruthenium films (before time $t_1$), the oxygen-containing gas is supplied earlier than the ruthenium raw gas, and the amount of supply of the oxygen-containing gas before the start of deposition is made smaller than the amount of supply of the oxygen-containing gas during the deposition and not greater than a value at which there takes place no deposition reaction. In addition, after the end of deposition of the ruthenium films (after time $t_2$), the amount of supply of the oxygen-containing gas is made smaller than the amount of supply of the oxygen-containing gas at the time of deposition, and not greater than a value at which there takes place no deposition reaction, and the supply of the ruthenium raw gas is stopped earlier than the supply of the oxygen-containing gas.

In this semiconductor device manufacturing method, too, since the oxygen ratios before the start of deposition of the ruthenium films and after the end of deposition thereof are smaller than the oxygen ratio at the time of deposition and not greater than the value at which there takes place no deposition reaction, there is deposited no ruthenium oxide, and hence it is possible to deposit the ruthenium films with excellent homogeneity in the film quality, and at the same time deposit the ruthenium films with excellent reproducibility of the surface morphology thereof.

Figure 8:
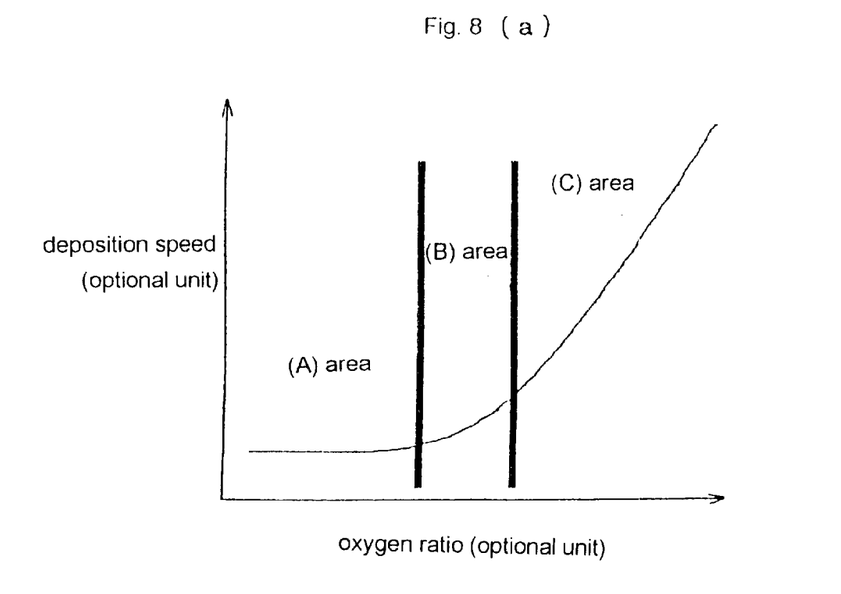
FIG. 8(a) is a graph illustrating the relation between the oxygen ratio and the deposition speed.
FIG. 8(b) is a graph illustrating the X-ray diffraction data of films deposited in areas (A), (B) and (C) of FIG. 8(a).

FIG. 8(a) is a graph in which the relation between the oxygen ratio and the deposition speed is illustrated. Also, FIG. 8(b) is a graph in which the X-ray diffraction data of ruthenium films deposited in areas (A), (B) and (C) of FIG. 8(a) are illustrated. As is clear from these graphs, a ruthenium film is deposited in the area (A) where the deposition speed is substantially stable. In addition, in the area (B) where the deposition speed is high, there is deposited a mixed crystal film composed of ruthenium and ruthenium oxide ($RuO_2$) Moreover, in the area (C) where the amount of change in the deposition speed is large, there is deposited a ruthenium oxide film. Accordingly, in order to obtain a pure ruthenium film, it is necessary to set the oxygen ratio, i.e., the volume ratio of the oxygen-containing gas to the ruthenium raw gas, during the deposition in such a manner that it falls within the range of area (A). Additionally, it is necessary to make the oxygen ratio so as not to exceed this range even before the start of the deposition and after the end of the deposition, and to this end, the method as explained with reference to FIG. 1 or FIG. 2 or FIG. 3 or FIG. 4 of the present invention will be effective.

Figure 9:
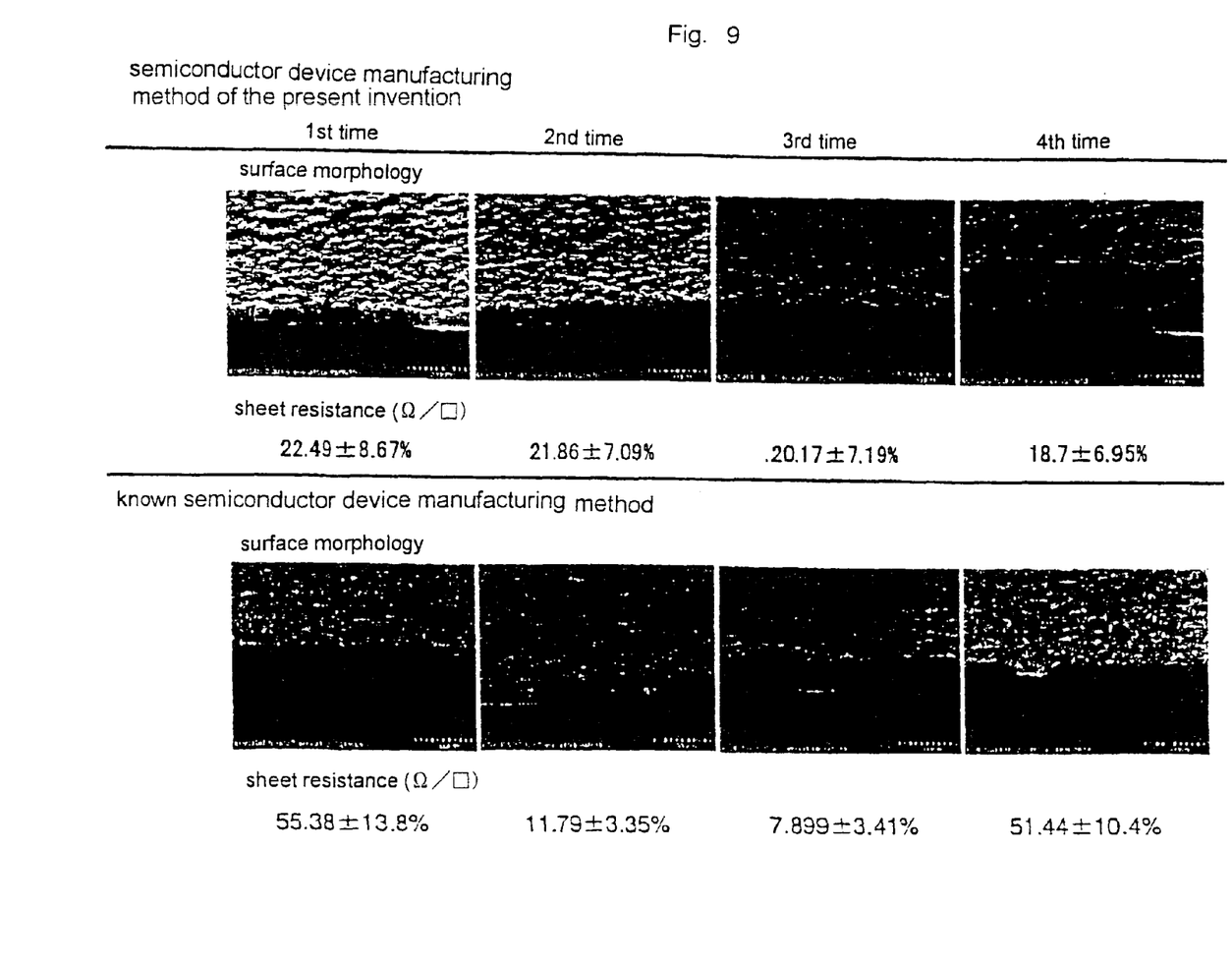
FIG. 9 illustrates microphotographs representing the reproducibility of the surface morphology according to a semiconductor device manufacturing method of the present invention and a known semiconductor device manufacturing method.

Moreover, FIG. 9 illustrates microphotographs representing the reproducibility of the surface morphology of ruthenium films when a plurality (four times) of depositions were carried out by a semiconductor device manufacturing method of the present invention and a known semiconductor device manufacturing method, respectively, wherein the sheet resistance values in the respective cases are shown. As is clear from these microphotographs, the method of the present invention is more excellent in the reproducibility of the surface morphology than the known method. That is, the change in the surface condition of the ruthenium film in each of the plurality of depositions of the ruthenium film is limited (stable) in case of the present invention, whereas the surface condition of the ruthenium film in each of the plurality of depositions of the ruthenium film changed greatly in case of the known method. Further, the present invention is more excellent in the reproducibility of the sheet resistance than the known method. That is, the change in the value of the sheet resistance of the ruthenium film in each of the plurality of depositions of the ruthenium film is limited (stable) in case of the present invention, whereas the value of the sheet resistance of the ruthenium film in each of the plurality of depositions of the ruthenium film changes greatly in case of the known method.

Incidentally, in the embodiment as explained with reference to FIG. 2, before the start of deposition, the ruthenium raw gas is supplied to the reaction chamber earlier than the oxygen-containing gas, whereas after the end of deposition of the ruthenium films, the supply of the oxygen-containing gas is stopped earlier than the supply of the ruthenium raw gas; and in the embodiment as explained with reference to FIG. 3, before the start of deposition of the ruthenium films, the ruthenium raw gas and the oxygen-containing gas are supplied to the reaction chamber at the same time, whereas after the end of deposition of the ruthenium films, the supply of the ruthenium raw gas and the supply of the oxygen-containing gas are stopped at the same time; and in the embodiment as explained with reference to FIG. 4, before the start of deposition of the ruthenium films, the oxygen-containing gas is supplied earlier than the ruthenium raw gas, whereas after the end of deposition of the ruthenium films, the supply of the ruthenium raw gas is stopped earlier than the supply of the oxygen-containing gas. However, the methods of starting the supply of the ruthenium raw gas and the supply of the oxygen-containing gas before the start of deposition of the ruthenium films, and the methods of stopping the supply of the ruthenium raw gas and the supply of the oxygen-containing gas after the end of deposition of the ruthenium films may be arbitrarily combined with one another. For instance, before the start of deposition of the ruthenium films, the raw material gas may be supplied to the reaction chamber earlier than the oxygen-containing gas, as shown in FIG. 2, and after the end of deposition of the ruthenium films, the supply of the ruthenium raw gas and the supply of the oxygen-containing gas may be stopped at the same time, as shown in FIG. 3. Also, before the start of deposition of the ruthenium films, the ruthenium raw gas may be supplied to the reaction chamber earlier than the oxygen-containing gas, as shown in FIG. 2, and after the end of deposition of the ruthenium films, the supply of the ruthenium raw gas may be stopped earlier than the supply of the oxygen-containing gas, as shown in FIG. 4. Moreover, before the start of deposition of the ruthenium films, the ruthenium raw gas and the oxygen-containing gas are supplied to the reaction chamber at the same time as shown in FIG. 3, and after the end of deposition of the ruthenium films, the supply of the oxygen-containing gas may be stopped earlier than the supply of the ruthenium raw gas, as shown in FIG. 2. In addition, before the start of deposition of the ruthenium films, the ruthenium raw gas and the oxygen-containing gas are supplied to the reaction chamber at the same time, as shown in FIG. 3, and after the end of deposition of the ruthenium films, the supply of the ruthenium raw gas may be stopped earlier than the supply of the oxygen-containing gas, as shown in FIG. 4. Further, before the start of deposition of the ruthenium films, the oxygen-containing gas is supplied earlier than the ruthenium raw gas, as shown in FIG. 4, and after the end of deposition of the ruthenium films, the supply of the oxygen-containing gas may be stopped earlier than the supply of the ruthenium raw gas, as shown in FIG. 2. Furthermore, before the start of deposition of the ruthenium films, the oxygen-containing gas is supplied earlier than the ruthenium raw gas, as shown in FIG. 4, and after the end of deposition of the ruthenium films, the supply of the ruthenium raw gas and the supply of the oxygen-containing gas are stopped at the same time, as shown in FIG. 3. Further, in the embodiment as explained with reference to FIG. 3, the amount of supply of the oxygen-containing gas before the start of deposition is gradually increased linearly, and the amount of supply of the oxygen-containing gas after the end of deposition is gradually decreased linearly, but instead, the amount of supply of the oxygen-containing gas before the start of deposition may be gradually increased stepwise, and the amount of supply of the oxygen-containing gas after the end of deposition may be gradually decreased stepwise. In addition, although in the above-mentioned embodiments, the explanation has been made of the case where the substrate is comprised of a silicon wafer, the present invention is also applicable to the case where ruthenium films are deposited on another substrate. Moreover, although in each of the embodiments as explained with reference to FIG. 1 through FIG. 4, the supply of the raw material gas containing ruthenium to the reaction chamber is started after the temperature of the silicon wafer has reached the processing temperature (290–350° C.), it is preferable that the supply of the raw material gas containing ruthenium be started in the course of rising in temperature of the silicon wafer. By doing so, when the temperature of the silicon wafer reaches the processing temperature, it is possible to create the state in which the flow rate of the raw material gas containing ruthenium has already been stabilized, so that deposition can be carried out quickly after a temperature rise of the silicon wafer. For similar reasons, it is also preferable that the introduction of the inert gas into the reaction chamber before deposition, the adjustment of the pressure in the reaction chamber or the like be carried out in the course of rising in temperature of the silicon wafer.

As described in detail, in the semiconductor device manufacturing method and the substrate processing apparatus according to the present invention, the oxygen ratio, i.e., the volume ratio of the oxygen-containing gas to ruthenium raw gas, before the start of deposition of the ruthenium films or after the end of deposition thereof, is smaller than the oxygen ratio at the time of deposition, and the oxygen ratio before the start of deposition of the ruthenium films or after the end of deposition thereof is not greater than a value at which there takes place no deposition reaction, there is deposited no ruthenium oxide, and hence it is possible to deposit the ruthenium films with excellent homogeneity in the film quality, and at the same time deposit the ruthenium films with excellent reproducibility of the surface morphology thereof.

Figure 5:
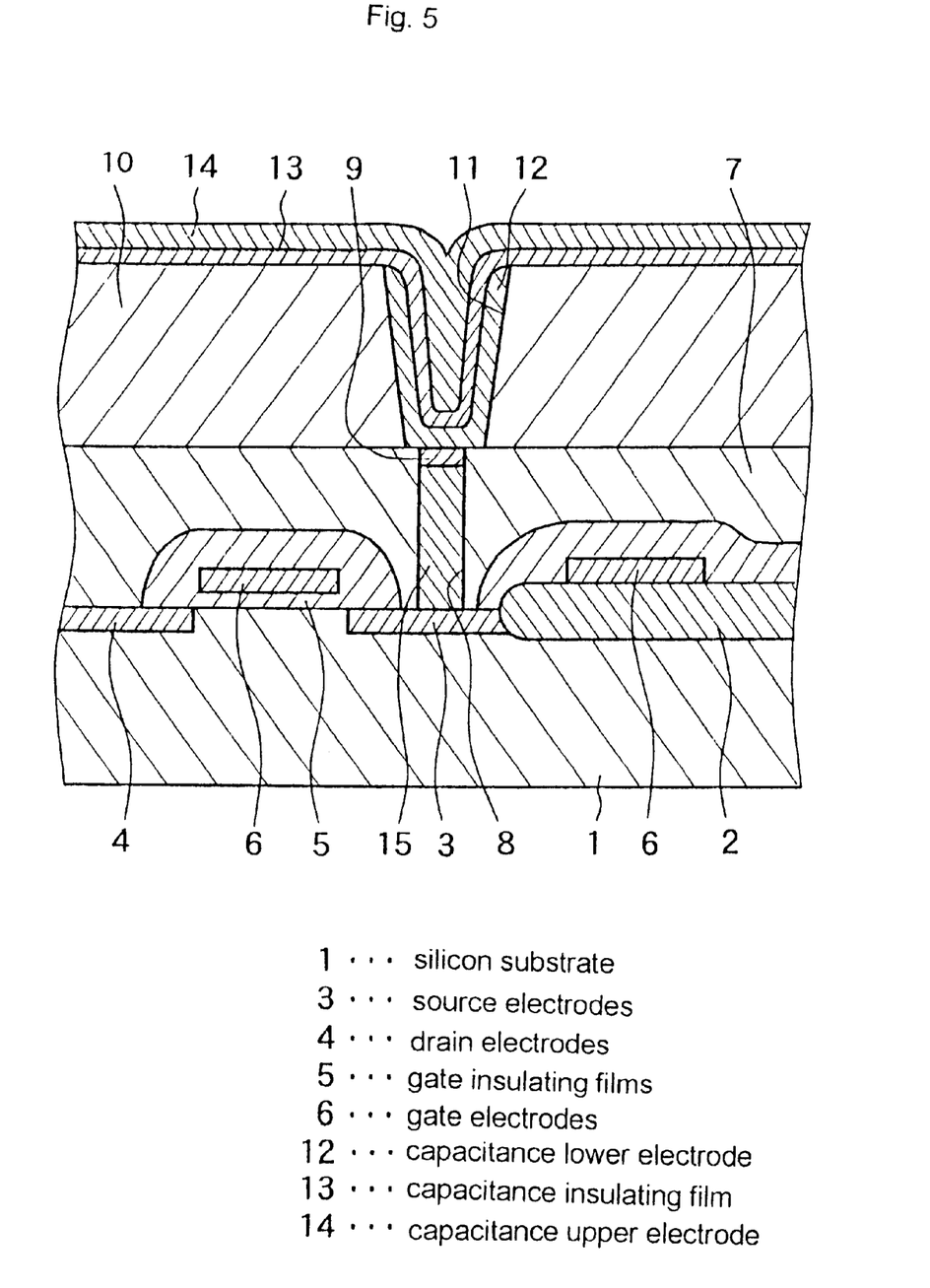
FIG. 5 is a cross sectional view illustrating a part of a DRAM which includes ruthenium films deposited by using a semiconductor device manufacturing method according to the present invention.

FIG. 5 illustrates, in cross section, a part of a DRAM including ruthenium films deposited by using a semiconductor manufacturing method of the present invention.

As shown in this figure, on a surface of a silicon substrate 1, there are deposited field oxide films 2 for forming a multitude of transistor-forming regions in a mutually separated manner. Also, on the surface of the silicon substrate 1, there are formed source electrodes 3 and drain electrodes 4 with gate electrodes 6 acting as word lines being disposed therebetween via gate insulation films 5, respectively, on which an interlayer insulation film 7 is provided. Contact holes 8 are formed through the interlayer insulation film 7, and a barrier metal 9 and a plug electrode 15 connected to a corresponding one of the source electrodes 3 are formed in each of the contact holes 8. On the interlayer insulation film 7, there is formed another interlayer insulation film 10 through which contact holes 11 are formed. On the interlayer insulation film 10 and in the contact holes 11, there is provided a capacitance lower electrode 12 which is made of ruthenium, formed by the manufacturing method of the present invention and connected with the barrier metals 9. Formed on the capacitance lower electrode 12 is a capacitance insulation film 13 made of $Ta_2O_5$ on which is formed a capacitance upper electrode 14 made of ruthenium or the like according to the manufacturing method of the present invention. Here, note that the capacitance upper electrode 14 may be made of titanium nitride. That is, with this DRAM, a capacitor cell is connected with the source electrode 3 of a MOS transistor.

Next, reference will be had to a method of manufacturing the DRAM illustrated in FIG. 5. First, a field oxide film 2 is formed in the surroundings of each transistor-forming region on the surface of the silicon substrate 1 by means of a LOCOS process. Subsequently, a gate electrode 6 is formed in each transistor-forming region through a corresponding gate insulation layer 5. Thereafter, impurities are introduced into the surface of the silicon substrate 1 by ion-implantation using the field oxide films 2 and the gate electrodes 6 as masks, thus forming the source electrodes 3 and the drain electrodes 4 in a self-aligned manner. After each gate electrode 6 is covered with an insulating film, the interlayer insulation film 7 is formed on the substrate 1. Then, each contact hole 8 through which a corresponding source electrode 3 is exposed is formed through the interlayer insulation film 7, and the plug electrode 15 and the barrier metal 9 are formed in each contact hole 8. Subsequently, the interlayer insulation film 10 is formed on the interlayer insulation film 7, and the contact holes 11 are formed through the interlayer insulation film 10 so as to expose the corresponding barrier metals 9, respectively. Thereafter, a ruthenium film is deposited on the interlayer insulation film 10 and in the contact holes 11 by means of the semiconductor manufacturing method of the present invention, and patterning is effected to provide the capacitance lower electrode 12. The capacitance insulation film 13 made of $Ta_2O_5$ is then formed on the capacitance lower electrode 12, and the capacitance upper electrode 14 made of ruthenium, titanium nitride, etc., is in turn formed on the capacitance insulation film 13. In case where ruthenium is used for the capacitance upper electrode 14, deposition is carried out according to the manufacturing method of the present invention.

What is claimed is:

1. A semiconductor device manufacturing method in which a ruthenium film is formed on a substrate by using a raw material gas containing ruthenium and an oxygen-containing gas containing oxygen, characterized by controlling an oxygen ratio before the start of deposition of said ruthenium film or after the end of deposition thereof to be smaller than an oxygen ratio at the time of deposition thereof.

2. The semiconductor device manufacturing method as set forth in claim 1, characterized by supplying said raw material gas earlier than said oxygen-containing gas before the start of deposition of said ruthenium film.

3. The semiconductor device manufacturing method as set forth in claim 1, characterized by gradually increasing the amount of supply of said oxygen-containing gas before the start of deposition when said raw material gas and said oxygen-containing gas are supplied at the same time before the start of deposition of said ruthenium film.

4. The semiconductor device manufacturing method as set forth in claim 1, characterized by controlling the amount of supply of said oxygen-containing gas before the start of deposition to be smaller than the amount of supply of said oxygen-containing gas at the time of deposition, or controlling the amount of supply of said oxygen-containing gas before the start of deposition to be not greater than a value at which there takes place no deposition reaction, when said oxygen-containing gas is supplied prior to the supply of said raw material gas before the start of deposition of said ruthenium film.

5. The semiconductor device manufacturing method as set forth in claim 1, characterized by stopping the supply of said oxygen-containing gas earlier than the supply of said raw material gas after the end of deposition of said ruthenium film.

6. The semiconductor device manufacturing method as set forth in claim 1, characterized by gradually decreasing the amount of supply of said oxygen-containing gas after the end of deposition when the supply of said raw material gas and the supply of said oxygen-containing gas are stopped at the same time after the end of deposition of said ruthenium film.

7. The semiconductor device manufacturing method as set forth in claim 1, characterized by controlling the amount of supply of said oxygen-containing gas after the end of deposition to be smaller than the amount of supply of said oxygen-containing gas at the time of deposition, or controlling the amount of supply of said oxygen-containing gas after the end of deposition to be not greater than a value at which there takes place no deposition reaction, when the supply of said raw material gas is stopped earlier than the supply of said oxygen-containing gas after the end of deposition of said ruthenium film.

8. The semiconductor device manufacturing method as set forth in claim 1, characterized by introducing a gas, which does not contribute to deposition reactions, before the start of deposition of said ruthenium film or after the end of deposition thereof, and holding substantially constant the pressures before the start of deposition, at the time of deposition and after the end of deposition.

9. The semiconductor device manufacturing method as set forth in claim 1, characterized in that said raw material gas containing ruthenium comprises a gas evaporated from $Ru(C_2H_5C_5H_4)_2$, and that said oxygen-containing gas containing oxygen comprises an $O_2$ gas.

10. A semiconductor device manufacturing method in which a ruthenium film is formed on a substrate by using a raw material gas containing ruthenium and an oxygen-containing gas containing oxygen, characterized by controlling an oxygenratio before the start of deposition of said ruthenium film or after the end of deposition thereof to be not greater than a value at which there takes place no deposition reaction.

11. The semiconductor device manufacturing method as set forth in claim 10, characterized by supplying said raw material gas earlier than said oxygen-containing gas before the start of deposition of said ruthenium film.

12. The semiconductor device manufacturing method as set forth in claim 10, characterized by gradually increasing the amount of supply of said oxygen-containing gas before the start of deposition when said raw material gas and said oxygen-containing gas are supplied at the same time before the start of deposition of said ruthenium film.

13. The semiconductor device manufacturing method as set forth in claim 10, characterized by controlling the amount of supply of said oxygen-containing gas before the start of deposition to be smaller than the amount of supply of said oxygen-containing gas at the time of deposition, or controlling the amount of supply of said oxygen-containing gas before the start of deposition to be not greater than a value at which there takes place no deposition reaction, when said oxygen-containing gas is supplied prior to the supply of said raw material gas before the start of deposition of said ruthenium film.

14. The semiconductor device manufacturing method as set forth in claim 10, characterized by stopping the supply of said oxygen-containing gas earlier than the supply of said raw material gas after the end of deposition of said ruthenium film.

15. The semiconductor device manufacturing method as set forth in claim 10, characterized by gradually decreasing the amount of supply of said oxygen-containing gas after the end of deposition when the supply of said raw material gas and the supply of said oxygen-containing gas are stopped at the same time after the end of deposition of said ruthenium film.

16. The semiconductor device manufacturing method as set forth in claim 10, characterized by controlling the amount of supply of said oxygen-containing gas after the end of deposition to be smaller than the amount of supply of said oxygen-containing gas at the time of deposition, or controlling the amount of supply of said oxygen-containing gas after the end of deposition to be not greater than a value at which there takes place no deposition reaction, when the supply of said raw material gas is stopped earlier than the supply of said oxygen-containing gas after the end of deposition of said ruthenium film.

17. The semiconductor device manufacturing method as set forth in claim 10, characterized by introducing a gas, which does not contribute to deposition reactions, before the start of deposition of said ruthenium film or after the end of deposition thereof so as to hold substantially constant the pressures before the start of deposition, at the time of deposition and after the end of deposition.

18. The semiconductor device manufacturing method as set forth in claim 10, characterized in that said raw material gas containing ruthenium comprises a gas evaporated from $Ru(C_2H_5C_5H_4)_2$, and that said oxygen-containing gas containing oxygen comprises an $O_2$ gas.

* * * * *